US010361391B2

(12) United States Patent
Kim et al.

(10) Patent No.: US 10,361,391 B2
(45) Date of Patent: Jul. 23, 2019

(54) ORGANIC LIGHT EMITTING DISPLAY DEVICE HAVING A CONNECTING CLAD ELECTRODE

(71) Applicant: LG Display Co., Ltd., Seoul (KR)

(72) Inventors: Gyung-Min Kim, Seoul (KR); Jeong-Hyeon Choi, Seoul (KR); Joon-Soo Han, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/856,313

(22) Filed: Dec. 28, 2017

(65) Prior Publication Data

US 2018/0190935 A1    Jul. 5, 2018

(30) Foreign Application Priority Data

Dec. 30, 2016  (KR) .......................... 10-2016-0184361

(51) Int. Cl.
*H01L 51/52* (2006.01)
*H01L 27/32* (2006.01)
*H01L 27/12* (2006.01)

(52) U.S. Cl.
CPC ........ *H01L 51/5228* (2013.01); *H01L 27/326* (2013.01); *H01L 27/3246* (2013.01); *H01L 27/3248* (2013.01); *H01L 27/3258* (2013.01); *H01L 27/3262* (2013.01); *H01L 27/3276* (2013.01); *H01L 27/3279* (2013.01); *H01L 51/5234* (2013.01); *H01L 27/1214* (2013.01); *H01L 2251/5315* (2013.01); *H01L 2251/568* (2013.01)

(58) Field of Classification Search
CPC .......... H01L 2251/568; H01L 51/5228; H01L 27/3276; H01L 27/3248; H01L 2251/5315
See application file for complete search history.

(56) References Cited

U.S. PATENT DOCUMENTS

| | | | |
|---|---|---|---|
| 2010/0231490 | A1 | 9/2010 | Okano |
| 2011/0204369 | A1 | 8/2011 | Ha et al. |
| 2013/0234624 | A1 | 9/2013 | Omoto |
| 2015/0171366 | A1* | 6/2015 | Kim .................... H01L 51/5246 257/40 |
| 2016/0380038 | A1 | 12/2016 | Kang et al. |

FOREIGN PATENT DOCUMENTS

| | | |
|---|---|---|
| CN | 102760750 B | 12/2014 |
| JP | 2010-056060 A | 3/2010 |
| JP | 2011-171278 A | 9/2011 |

(Continued)

OTHER PUBLICATIONS

CN102760750B_MT. pdf (machine translation of CN 102760750 B).*

(Continued)

*Primary Examiner* — Mohammed R Alam
(74) *Attorney, Agent, or Firm* — Morgan, Lewis & Bockius LLP

(57) ABSTRACT

An organic light-emitting display device in which a connecting clad electrode is disposed between the thin film transistor and the light-emitting structure is provided. The connecting clad electrode may include a repair cutting region overlapping with a transparent of a lower substrate. Thus, in the organic light-emitting display device, reducing the area of the transparent area by the repair cutting region may be prevented.

15 Claims, 4 Drawing Sheets

(56) References Cited

FOREIGN PATENT DOCUMENTS

TW   201501289 A   1/2015
WO   2007/125768 A1   11/2007

OTHER PUBLICATIONS

Extended European Search Report dated Jun. 11, 2018 from the European Patent Office in counterpart EP application No. 17209655A.
Office Action dated Nov. 6, 2018 from the Taiwanese Patent Office in counterpart Taiwanese patent application No. 1061465680.
Office Action dated Nov. 20, 2018 from the Japanese Patent Office in counterpart Japanese patent application No. 2017-247197.

* cited by examiner

ORGANIC LIGHT EMITTING DISPLAY DEVICE HAVING A CONNECTING CLAD ELECTRODE

This application claims the priority benefit of Korean Patent Application No. 10-2016-0184361, filed on Dec. 30, 2016, which is hereby incorporated by reference as if fully set forth herein.

BACKGROUND

Technical Field

The present invention relates to an organic light-emitting display device in which a thin film transistor and a light-emitting structure are connected by a connecting clad electrode.

Discussion of the Related Art

Generally, an electronic appliance, such as a monitor, a TV, a laptop computer, and a digital camera, include a display device to realize an image. For example, the display device may include a liquid crystal display device and an organic light-emitting display device.

The organic light-emitting display device may be a transparent display device. For example, each pixel area of the organic light-emitting display device may include an emission area and a transparent area. A light-emitting structure and a circuit for controlling the light-emitting structure may be disposed in the emission area. The external light may transmit the transparent area.

The emission area may display various color for realizing an image. For example, a blue light-emitting structure for displaying a blue color, a red light-emitting structure for displaying a red color, a green light-emitting structure for displaying a green color and a white light-emitting structure for display a white color are disposed in the emission area. Each of the light-emitting structure may include a lower emission electrode, an organic light-emitting layer and an upper emission electrode, which area sequentially stacked.

A defect of some light-emitting structures may occur due to a particle generated in a process of forming the organic light-emitting display device. The process of forming the organic light-emitting display device may include a repair process in order to minimize decrease of an image quality caused by defective light-emitting structures. For example, the repair process of the organic light-emitting display device may include a step of electrically disconnecting the lower emission electrode which is short-circuited with the upper emission electrode by the particles from corresponding circuit.

The step of electrically disconnecting the lower emission electrode of the light-emitting structure which has a defect from the corresponding circuit may include a laser cutting process. For example, the repair process of the organic light-emitting display device may include a step of cutting a portion of the lower emission electrode using the laser. For the convenience of the process, the repair cutting region of the lower emission electrode cut by the repair process may overlap with the transparent area of the lower substrate.

However, since the lower emission electrode of the organic light-emitting display device includes a reflective layer, the area of the transparent area may be reduced due to the repair cutting region. Also, in the organic light-emitting display device, the repair cutting region may be disposed in the light-emitting area of the lower substrate to prevent reducing the area of the transparent, but the opening of the emission area may be reduced. Thus, in the organic light-emitting display device, the luminous efficacy may be decreased and the element adjacent to the repair cutting area may be damaged by the repair process.

SUMMARY

Accordingly, embodiments of the present disclosure are directed to an organic light-emitting display device having a connecting clad electrode that substantially obviates one or more of the problems due to limitations and disadvantages of the related art An aspect of the present disclosure is to provide an organic light-emitting display device capable of preventing decreasing of the area of the transparent by a repair cutting region.

Another aspect of the present disclosure is to provide an organic light-emitting display device which may increase a transmissivity of a transparent area without reducing an opening of a light-emitting area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light-emitting display device comprises a lower substrate. The lower substrate includes an emission area and a transparent area. A thin film transistor is disposed on the emission area of the lower substrate. A light-emitting structure on the thin film transistor. The light-emitting structure includes a lower emission electrode, an organic light-emitting layer and an upper emission electrode, which are sequentially stacked. The light-emitting structure is electrically connected to the thin film transistor by a connecting clad electrode. The connecting clad electrode has the transmissivity higher than the lower emission electrode. The connecting clad electrode includes a repair cutting region overlapping with the transparent area of the lower substrate.

The connecting clad electrode may include a conductive oxide such as ITO.

A first connection electrode may be disposed between the thin film transistor and the connecting clad electrode. The first connection electrode may be connected to the thin film transistor. The connecting clad electrode may further include a first clad region covering the first connection electrode.

A second connection electrode may be disposed between a lower over-coat layer and the connecting clad electrode. The second connection electrode may be spaced apart from the first connection electrode. The connecting clad electrode may further include a second clad region covering the second connection electrode. The repair cutting region may be disposed between the first clad region and the second clad region.

The first connection electrode and the second connection electrode may be extended along the connecting clad electrode on the emission area of the lower substrate.

In another aspect, an organic light-emitting display device comprises a lower substrate. The lower substrate includes an emission area and a transparent area. A thin film transistor is disposed on the emission area of the lower substrate. A lower over-coat layer is disposed on the thin film transistor. The lower over-coat layer includes a lower penetrating hole exposing a portion of the thin film transistor. A first connection electrode is disposed on the lower over-coat layer.

The first connection electrode is connected to the thin film transistor through the lower penetrating hole. A second connection electrode is disposed on the lower over-coat layer. The second connection electrode is spaced apart from the first connection electrode. An upper over-coat layer is disposed on the first connection electrode and the second connection electrode. The upper over-coat layer includes an upper penetrating hole overlapping with the second connection electrode. A light-emitting structure is disposed on the upper over-coat layer. The light-emitting structure includes a lower emission electrode connected to the second connection electrode through the upper penetrating hole. A connecting clad electrode is disposed between the lower over-coat layer and the upper over-coat layer. The connecting clad electrode is connected between the first connection electrode and the second connection electrode. The connecting clad electrode includes a repair cutting region overlapping with the transparent area of the lower substrate.

The connecting clad electrode may have the transmissivity higher than the first connection electrode, the second connection electrode and the lower emission electrode.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
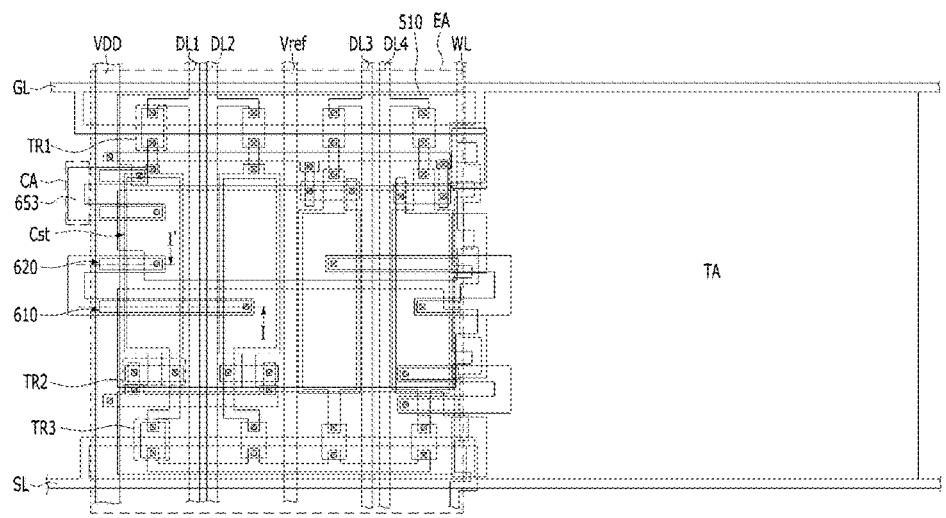
FIG. 1 is a view schematically showing a lay-out of an organic light-emitting display device according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention may be embodied in other forms and is not limited to the embodiments described below.

In addition, the same or extremely similar elements may be designated by the same reference numerals throughout the specification, and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

(Embodiment)

Figure 2A:
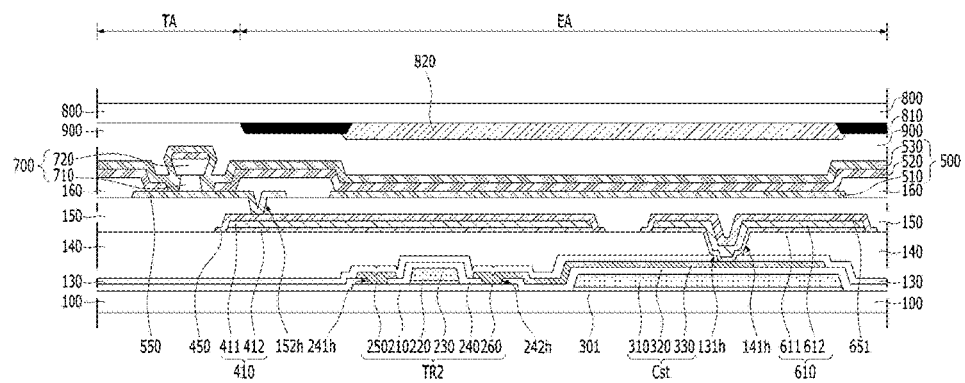
FIG. 2A is a cross-section view schematically the organic light-emitting display device according to the embodiment of the present invention.
Figure 2B:
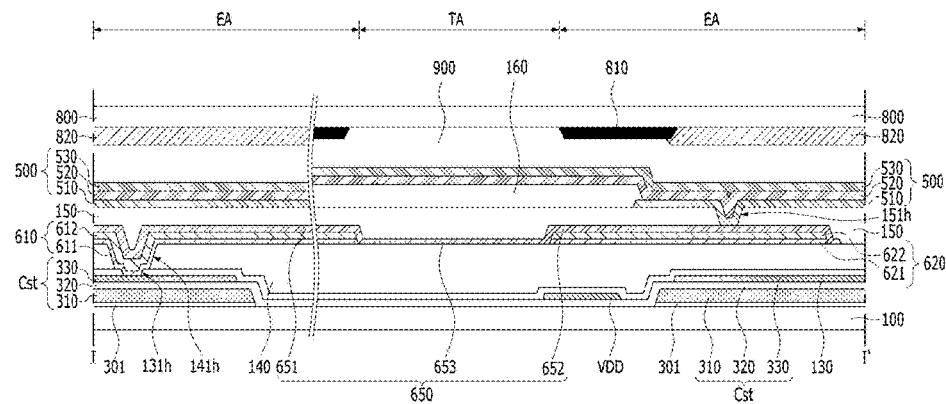
FIG. 2B is a view taken along I-I' of FIG. 1

FIG. 1 is a view schematically showing a lay-out of an organic light-emitting display device according to an embodiment of the present invention. FIG. 2A is a cross-section view schematically the organic light-emitting display device according to the embodiment of the present invention. FIG. 2B is a view taken along I-I' of FIG. 1

Referring to FIGS. 1, 2A and 2B, the organic light-emitting display device according to the embodiment of the present invention may comprise a lower substrate 100, an auxiliary electrode 410, light-emitting structure 500 and a connecting clad electrode 650.

The lower substrate 100 may support the light-emitting structure 500. The lower substrate 100 may include an insulating material. For example, the lower substrate 100 may include glass or plastic.

The lower substrate 100 may include pixel areas. Each of the pixel areas may include an emission area EA and a transparent area TA. The emission area EA may display a color for realizing an image. A plurality of the light-emitting structures 500 may be disposed in the light-emitting area EA. For example, a blue light-emitting structure for displaying a blue color, a red light-emitting structure for displaying a red color, a green light-emitting structure for displaying a green color and a white light-emitting structure for display a white color may be disposed in the emission area EA. The transparent area TA may be transparent.

As shown in FIG. 1, a gate line GL, data lines DL1-DL4, a sensing line SL, a reference voltage supply line Vref and a power supply line VDD may be disposed on the lower substrate 100. The gate line GL may extend in a direction. The data lines DL1-DL4 may intersect the gate line GL. The data lines DL1-DL4 may transmit a data signal to the light-emitting structure 500 disposed in the emission area EA. For example, the organic light-emitting display device according to the embodiment of the present invention may include four data lines DL1-DL4. The sensing line SL may be parallel with the gate line SL. The reference voltage supply line Vref and the power supply line VDD may be parallel with the data lines DL1-DL4.

The gate line GL, the data lines DL1-DL4, the sensing line SL, the reference voltage supply line Vref and the power supply line VDD may define a sub emission area in the emission area EA. For example, a circuit for controlling one of the light-emitting structures 500 may be disposed in each of the sub emission area. In the organic light-emitting display device according to the embodiment of the present invention, each of the emission areas EA may include four sub emission areas separated by the gate line GL, the data lines DL1-DL4, the sensing line SL, the reference voltage supply line Vref and the power supply line VDD. For example, a selective thin film transistor TR1, a driving thin film transistor TR2, a sensing thin film transistor TR3 and a storage capacitor Cst may be disposed in each sub emission area.

The selective thin film transistor TR1 may turn on/off the driving thin film transistor according to a gate signal applied by the gate line GL. The driving thin film transistor TR2 may supply a driving current to corresponding light-emitting structure 500 according to a signal of the selective thin film transistor TR1 and a data signal applied by corresponding data line DL1-DL4. The degree of deterioration of each driving thin film transistor TR2 and/or each light-emitting structure 500 may be detected by corresponding sensing thin film transistor TR3. The storage capacitor Cst may maintain the signal of the selective thin film transistor TR1 applied to the driving thin film transistor TR2 for a certain period of time.

Structures of the selective thin film transistor TR1 and the sensing thin film transistor TR3 may be the same as a structure of the driving thin film transistor TR2. For example, the driving thin film transistor TR2 may includes a semiconductor pattern 210, a gate insulating layer 220, a gate electrode 230, an interlayer insulating layer 240, a source electrode 250 and a drain electrode 260, as shown in FIG. 2A.

The semiconductor pattern 210 may be disposed on the lower substrate 100. The semiconductor pattern 210 may include a semiconductor material. For example, the semiconductor pattern 210 may include amorphous silicon or polycrystalline silicon. The semiconductor pattern 210 may include an oxide semiconductor material. For example, the semiconductor pattern 210 may include IGZO.

The semiconductor pattern 210 may include a source region, a drain region and a channel region. The channel region may be disposed between the source region and the drain region. Conductivity of the channel region may be lower than conductivities of the source region and the drain region. For example, the source region and the drain region may include a conductive impurity.

The organic light-emitting display device according to the embodiment of the present invention is described that the semiconductor pattern 210 of each thin film transistor TR1, TR2 and TR3 is in direct contact with the lower substrate 100. However, the organic light-emitting display device according to another embodiment of the present invention may further include a buffer layer disposed between the lower substrate 100 and the thin film transistors TR1, TR2 and TR3. The buffer layer may be extended beyond the semiconductor pattern 210. For example, the buffer layer may cover the entire surface of the lower substrate 100. The buffer layer may include an insulating material. For example, the buffer layer may include silicon oxide.

The gate insulating layer 220 may be disposed on the semiconductor pattern 210. The gate insulating layer 220 may include an insulating material. For example, the gate insulating layer 220 may include silicon oxide and/or silicon nitride. The gate insulating layer 220 may have a multi-layer structure. The gate insulating layer 220 may include a high-K material. For example, the gate insulating layer 220 may include hafnium oxide (HfO) or titanium oxide (TiO).

The gate electrode 230 may be disposed on the gate insulating layer 220. The gate electrode 230 may overlap the channel region of the semiconductor pattern 210. The gate electrode 230 may be insulated from the semiconductor pattern 210 by the gate insulating layer 220. For example, the gate insulating layer 220 may include a side surface vertically align with a side surface of the gate electrode 230. The side surface of the gate insulating layer 220 may be continuously with the side surface of the gate electrode 230.

The gate electrode 230 may include a conductive material. For example, the gate electrode 230 may include a metal, such as aluminum (Al), chrome (Cr), cupper (Cu), titanium (Ti), molybdenum (Mo) and tungsten (W). The gate electrode 230 may have a multi-layer structure. The gate line GL which is shown in FIG. 1 may include a material same as the gate electrode 230. The gate electrode 230 may be disposed on a layer same as the gate line GL. For example, a structure of the gate line GL may be the same as a structure of the gate electrode 230.

The interlayer insulating layer 240 may be disposed on the semiconductor pattern 210 and the gate electrode 230. The interlayer insulating layer 240 may be extended beyond the semiconductor pattern 210. For example, the interlayer insulating layer 240 may be in direct contact with the buffer layer in the outside of the semiconductor pattern 210. The interlayer insulating layer 240 may include an insulating material. For example, the interlayer insulating layer 240 may include silicon oxide.

The source electrode 250 and the drain electrode 260 may be disposed on the interlayer insulating layer 240. The source electrode 250 may be electrically connected to the source region of the semiconductor pattern 210. The drain electrode 260 may be electrically connected to the drain region of the semiconductor pattern 210. For example, the interlayer insulating layer 240 may include a first interlayer contact hole 241h exposing the source region of the semiconductor pattern 210 and a second interlayer contact hole 242h exposing the drain region of the semiconductor pattern 210. The drain electrode 260 may be spaced apart from the source electrode 250.

The source electrode 250 and the drain electrode 260 may include a conductive material. For example, the source electrode 250 and the drain electrode 260 may include metal, such as aluminum (Al), chrome (Cr), cupper (Cu), titanium (Ti), molybdenum (Mo) and tungsten (W). The drain electrode 260 may include a material same as the source electrode 250. The source electrode 250 may have a multi-layer structure. A structure of the drain electrode 260 may be the same as a structure of the source electrode 250. For example, the drain electrode 260 may have a multi-layer structure.

The data lines DL1-DL4, the reference voltage supply line Vref and the power supply line VDD which are shown in FIG. 1 may include a material same as the source electrode 250 and the drain electrode 260. The data lines DL1-DL4, the reference voltage supply line Vref and the power supply line VDD may be disposed on a layer same as the source electrode 250 and the drain electrode 260. For example, the data lines DL1-DL4, the reference voltage supply line Vref and the power supply line VDD may be disposed on the interlayer insulating layer 240. Structures of the data lines DL1-DL4, the reference voltage supply line Vref and the power supply line VDD may be the same as the structure of the source electrode 250 and the structure of the drain electrode 260. For example, the data lines DL1-DL4 and the power supply line VDD may have a multi-layer structure.

The organic light-emitting display device according to the embodiment of the present invention is described that each of the thin film transistors TR1, TR2 and TR3 includes the interlayer insulating layer 240 between gate electrode 230 and source/drain electrode 250 and 260. However, in the organic light-emitting display device according to another embodiment of the present invention, each of the thin film transistors TR1, TR2 and TR3 may include a gate insulating layer 220 between the gate electrode 230 and the source/drain electrodes 250 and 260.

The storage capacitor Cst may be spaced apart from the thin film transistors TR1, TR2 and TR3, as shown in FIG. 2A. The storage capacitor Cst may be electrically connected to the thin film transistors TR1, TR2 and TR3. For example, the storage capacitor Cst may include a lower capacitor electrode 310, a capacitor insulating layer 320 and an upper capacitor electrode 330, which are sequentially stacked.

The lower capacitor electrode 310 and the upper capacitor electrode 330 may include a conductive material. For example, the lower capacitor electrode 310 may include a material same as the gate electrode 230. A structure of the lower capacitor electrode 310 may be the same as the structure of the gate electrode 230. The upper capacitor electrode 330 may include a material same as the source electrode 250 and the drain electrode 260. A structure of the upper capacitor electrode 330 may be the same as the structure of the source electrode 250 and the structure of the drain electrode 260. For example, the upper capacitor electrode 330 may be connected to the drain electrode 260 of the driving thin film transistor TR2. The upper capacitor electrode 330 may have a multi-layer structure.

The capacitor insulating layer 320 may include an insulating material. For example, the capacitor insulating layer 320 may include silicon oxide. The capacitor insulating layer 320 may include a material same as the interlayer insulating layer 240. For example, the capacitor insulating layer 320 may be continuously with the interlayer insulating layer 240.

As shown in FIGS. 2A and 2B, the organic light-emitting display device according to the embodiment of the present invention may further include a lower insulating layer 301 between the lower substrate 100 and the storage capacitor Cst. A side surface of the lower insulating layer 301 may be continuously with a side surface of the lower capacitor electrode 310. For example, the lower insulating layer 301 may include a material same as the gate insulating layer 220.

As shown in FIG. 1, a dummy pattern WL may be disposed on the lower substrate 100. For example, the dummy pattern WL may extend along a direction parallel with the data lines DL1-DL4. The dummy pattern WL may extend between the emission area EA and the transparent area TA. For example, the dummy pattern WL may include a region overlapping with the transparent area TA of the lower substrate 100.

The dummy pattern WL may include a conductive material. The dummy pattern WL may include a material same as one of conductive layers of the thin film transistors TR1, TR2 and TR3. For example, the dummy pattern WL may include a material same as the source electrode 250 and the drain electrode 260. The dummy pattern WL may include a material same as the data lines DL1-DL4.

As shown in FIGS. 2A and 2B, the organic light-emitting display device according to the embodiment of the present invention may further include a lower passivation layer 130 on the thin film transistors TR1, TR2 and TR3, the storage capacitor Cst and the dummy pattern WL. The lower passivation layer 130 may prevent the thin film transistors TR1, TR2 and TR3 from the external moisture and the hydrogen. The thin film transistors TR1, TR2 and TR3, the storage capacitor Cst and the dummy pattern WL may be covered by the lower passivation layer 130. The lower passivation layer 130 may include an insulating material. For example, the lower passivation layer 130 may include silicon oxide and/or silicon nitride.

As shown in FIG. 2A, the auxiliary electrode 410 may be disposed on the lower passivation layer 130. The auxiliary electrode 410 may be disposed in the emission area EA. For example, the auxiliary electrode 410 may be disposed on the thin film transistors TR1, TR2 and TR3. The auxiliary electrode 410 may include a conductive material. For example, the auxiliary electrode 410 may include a metal, such as copper (Cu), molybdenum (Mo), titanium (Ti), aluminum (Al) and tungsten (W). The auxiliary electrode 410 may have a multi-layer structure. For example, the auxiliary electrode 410 may include a lower auxiliary electrode 411 and an upper auxiliary electrode 412 disposed on the lower auxiliary electrode 411.

As shown in FIG. 2A, the organic light-emitting display device according to the embodiment of the present invention may further include an auxiliary clad electrode 450 on the auxiliary electrode 410. The auxiliary clad electrode 450 may prevent the auxiliary electrode 410 from being damaged by the subsequent process. For example, the auxiliary electrode 410 may be covered by the auxiliary clad electrode 450. The auxiliary clad electrode 450 may include a conductive material. The auxiliary clad electrode 450 may include a material having low reactivity. The auxiliary clad electrode 450 may include a material having high transmissivity. For example, the auxiliary clad electrode 450 may include a conductive oxide, such as ITO or IZO.

As shown in FIGS. 2A and 2B, the organic light-emitting display device according to the embodiment of the present invention may further include a lower over-coat layer 140 between the lower passivation layer 130 and the auxiliary electrode 410. The lower over-coat layer 140 may remove the thickness difference due to the thin film transistors TR1, TR2 and TR3 and the storage capacitor Cst. For example, an upper surface of the lower over-coat layer 140 opposite to the lower substrate 100 may be flat surface. The upper surface of the lower over-coat layer 140 may be parallel with a surface of the lower substrate 100. The lower over-coat layer 140 may include an insulating material. For example, the lower over-coat layer 140 may include an organic insulating material.

The light-emitting structure 500 may generate the light realizing a specific color. The light-emitting structure 500 may be disposed in the emission area EA. For example, the light-emitting structure 500 may be disposed on the auxiliary electrode 410. The light-emitting structure 500 may include a lower emission electrode 510, an organic light-emitting layer 520, and an upper emission electrode 530, which are sequentially stacked.

The organic light-emitting display device according to the embodiment of the present invention may further include an upper over-coat layer 150 between the auxiliary electrode 410 and the light-emitting structure 500. The upper over-coat layer 150 may remove the thickness difference due to the auxiliary electrode 410. For example, an upper surface of the upper over-coat layer 150 facing the light-emitting structure 500 may be a flat surface. The upper surface of the upper over-coat layer 150 may be parallel with the upper surface of the lower over-coat layer 140. The upper over-coat layer 150 may included an insulating material. For example, the upper over-coat layer 150 may include an organic insulating material. The upper over-coat layer 150 may include a material different from the lower over-coat layer 140.

The lower emission electrode 510 may include a conductive material. The lower emission electrode 510 may include a material having high reflective. For example, the lower emission electrode 510 may include a reflective layer having a metal, such as aluminum (Al) and silver (Ag). The lower emission electrode 510 may have a multi-layer structure. For example, the lower emission electrode 510 may have a structure in which a reflective layer including a material with high reflective is disposed between transparent electrodes including conductive oxide, such as ITO.

The organic light-emitting layer 520 may generate light having luminance corresponding to a voltage difference between the lower emission electrode 510 and the upper emission electrode 530. For example, the organic light-emitting layer 520 may include an emission material layer (EML) having an organic emission material. The organic light-emitting layer 520 may have a multi-layer structure in order to increase luminous efficacy. For example, the organic light-emitting layer 520 may further include at least one of a hole injection layer (HIL), a hole transport layer (HTL), an electron transport layer (ETL), and an electron injection layer (EIL).

The upper emission electrode 530 may include a conductive material. The upper emission electrode 530 may include a material different from the lower emission electrode 510. For example, the upper emission electrode 530 may be a transparent electrode. Thus, in the organic light-emitting display device according to the embodiment of the present invention, the light generated by the organic light-emitting layer 520 may be emitted through the upper emission electrode 530.

As shown in FIG. 2B, the connecting clad electrode 650 may connect the lower emission electrode 510 of the light-emitting structure 500 to corresponding driving thin film transistor TR2. Thus, in the organic light-emitting display device according to the embodiment of the present invention, the light-emitting structure 500 may be controlled by corresponding thin film transistors TR1, TR2 and TR3.

The connecting clad electrode 650 may be disposed between the lower over-coat layer 140 and the upper over-coat layer 150. For example, the lower passivation layer 130 may include an electrode contact hole 131h exposing a portion of the upper capacitor electrode 330 which is connected to the drain electrode 260 of corresponding driving thin film transistor TR2. The lower over-coat layer 140 may include a lower contact hole 141h overlapping with the electrode contact hole 131h. The upper over-coat layer 150 may include an upper contact hole 151h exposing a portion of the connecting clad electrode 650.

The upper contact hole 151h may be spaced apart from the lower contact hole 141h. For example, the connecting clad electrode 650 may include a first clad region 651 including a portion overlapping with the lower contact hole 151h, a second clad region 652 including a portion overlapping with the upper contact hole 151h and a repair cutting region 653 between the first clad region 651 and the second clad region 652, as shown in FIG. 2B. The repair cutting region 653 may overlap with the transparent area TA of the lower substrate 100. For example, the repair cutting region 653 may be disposed in a laser cutting area where the laser is irradiated in the repair process.

The connecting clad electrode 650 may include a conductive material. Transmissivity of the connecting clad electrode 650 may be higher than transmissivity of the lower emitting electrode 510. For example, the connecting clad electrode 650 may include a conductive oxide. The connecting clad electrode 650 may include a material same as the auxiliary clad electrode 450. For example, the connecting clad electrode 650 may include ITO or IZO.

In the organic light-emitting display device according to the embodiment of the present invention, the connecting clad electrode 650 connecting the lower emission electrode 510 to corresponding driving thin film transistor TR2 may include the repair cutting region 653. Thus, in the organic light-emitting display device according to the embodiment of the present invention, the luminous efficacy of the light-emitting structure 500 may not be influenced by the transmissivity of the repair cutting region 653. That is, in the organic light-emitting display device according to the embodiment of the present invention, since the connecting clad electrode 650 including the repair cutting region 653 has higher transmissivity than the lower emission electrode 510, the reduction of the area of the transparent area TA due to the repair cutting region 653 may be prevented without losing the luminous efficacy.

As shown in FIG. 2B, the organic light-emitting display device according to the embodiment of the present invention may further include a first connection electrode 610 electrically connecting the connecting clad electrode 650 to the drain electrode 260 of corresponding driving thin film transistor TR2. The first connection electrode 610 may be disposed between the lower over-coat layer 140 and the upper over-coat layer 150. For example, the connecting clad electrode 650 may extend onto the first connection electrode 610. The first connection electrode 610 may be covered by the first clad region 651 of the connecting clad electrode 650.

The first connection electrode 610 may be extended along the electrode contact hole 131h and the lower contact hole 141h. For example, the first connection electrode 610 may be connected to the upper capacitor electrode 330 through the electrode contact hole 131h and the lower contact hole 141h.

The first connection electrode 610 may include a conductive material. Conductivity of the first connection electrode 610 may be higher than conductivity of the connecting clad electrode 650. For example, the first connection electrode 610 may include a metal, such as copper (Cu), molybdenum (Mo), titanium (Ti), aluminum (Al) and tungsten (W). Transmissivity of the first connection electrode 610 may be lower than transmissivity of the connecting clad electrode 650. A structure of the first connection electrode 610 may be the same as the structure of the auxiliary electrode 410. For example, the first connection electrode 610 may have a multi-layer structure. The first connection electrode 610 may include a first lower connection electrode 611 and a first upper connection electrode 612 disposed on the first lower connection electrode 611. For example, the first lower connection electrode 611 may include a material same as the lower auxiliary electrode 411. For example, the first upper connection electrode 612 may include a material same as the upper auxiliary electrode 412.

The first connection electrode 610 may be disposed on the emission area EA of the lower substrate 100. For example, the first connection electrode 610 may be extended along the connecting clad electrode 650 on the emission area EA of the lower substrate 100. Thus, in the organic light-emitting display device according to the embodiment of the present invention, the resistance between the light-emitting structure 500 and corresponding driving thin film transistor TR2 which are electrically connected by the connecting clad electrode 650 may be reduced.

As shown in FIG. 2B, the organic light-emitting display device according to the embodiment of the present invention may further include a second connection electrode 620 between the lower over-coat layer 140 and the second clad region 652 of the connecting clad electrode 650. For example, the second connection electrode 620 may include a portion overlapping with the upper contact hole 151h of the upper over-coat layer 150. The second clad region 652 of the connecting clad electrode 650 may cover the second connection electrode 620.

The second connection electrode 620 may include a conductive material. Conductivity of the second connection electrode 652 may be higher than the conductivity of the connecting clad electrode 650. For example, the second connection electrode 620 may include a metal, such as copper (Cu), molybdenum (Mo), titanium (Ti), aluminum (Al) and tungsten (W). The conductivity of the second connection electrode 620 may be the same as the conductivity of the first connection electrode 610. Transmissivity of the second connection electrode 620 may be lower than the transmissivity of the connecting clad electrode 650. For example, the transmissivity of the second connection electrode 620 may be the same as the transmissivity of the first connection electrode 610. A structure of the second connection electrode 620 may be the same as the structure of the first connection electrode 610. For example, the second connection electrode 620 may have a multi-layer structure. The structure of the second connection electrode 620 may be the same as the structure of the auxiliary electrode 410. The second connection electrode 620 may include a second lower connection electrode 621 and a second upper connection electrode 622 disposed on the second lower connection electrode 621. For example, the second lower connection electrode 621 may include a material same as the first lower connection electrode 611. For example, the second upper connection electrode 622 may include a material same as the first upper connection electrode 612.

The second connection electrode 620 may be disposed in the emission area EA of the lower substrate 100. For example, the second connection electrode 620 may be extended along the connecting clad electrode 650 on the emission area EA of the lower substrate 100. Thus, in the organic light-emitting display device according to the embodiment of the present invention, the resistance between the light-emitting structure 500 and corresponding driving thin film transistor TR2 which are electrically connected by the connecting clad electrode 650 may be reduced.

As shown in FIGS. 2A and 2B, the organic light-emitting display device according to the embodiment of the present invention may further include a bank insulating layer 160 in order to insulate adjacent light-emitting structures 500. For example, the bank insulating layer 160 may cover an edge of the lower emission electrode 510 of each light-emitting structure 500. The organic light-emitting layer 520 and the upper emission electrode 530 may be stacked on a portion of the lower emitting electrode 510 exposed by the bank insulating layer 160. The bank insulating layer 160 may include an insulating material. For example, the bank insulating layer 160 may include an organic insulating material, such as benzocyclobutene (BCB), poly-imide or photo-acryl. The lower over-coat layer 140 and the upper over-coat layer 150 may include a material different from the bank insulating layer 160.

The organic light-emitting layer 520 and the upper emission electrode 530 may be extended onto the bank insulating layer 160. The upper emission electrode 530 may be connected to the auxiliary electrode 410, as shown in FIG. 2A. Thus, in the organic light-emitting display device according to the embodiment of the present invention, the luminance unevenness due to the voltage drop of the upper emission electrode 530 may be prevented.

As shown in FIG. 2A, the organic light-emitting display device according to the embodiment of the present invention may further include a partition 700 in order to provide a space for electrically connecting the upper emission electrode 530 to the auxiliary electrode 410. For example, a portion of the organic light-emitting layer 520 may separated from another portion of the organic light-emitting layer 520 by the partition 700. The upper emission electrode 530 may be electrically connected to the auxiliary electrode 410 through the space between the separated portions of the organic light-emitting layer 520 separated by the partition 700. A vertical distance of the partition 700 may be larger than a vertical thickness of the bank insulating layer 160. For example, the partition 700 may include a lower partition 710 and an upper partition 720 disposed on the lower partition 710. The lower partition 710 and the upper partition 720 may include an insulating material. For example, the lower partition 710 may include a material same as the bank insulating layer 160. The upper partition 720 may include a material different from the lower partition 710. For example, the upper partition 720 may include silicon oxide and/or silicon nitride.

As shown in FIG. 2A, the organic light-emitting display device according to the embodiment of the present invention may further include an intermediate electrode 550 between the auxiliary electrode 410 and the bank insulating layer 160. The intermediate electrode 550 may be connected to the auxiliary electrode 410. For example, the upper over-coat layer 150 may include a penetrating hole 152h exposing a portion of the auxiliary electrode 410. The partition 700 may overlap with the intermediate electrode 550. For example, the organic light-emitting layer 520 may expose a portion of the intermediate electrode 550 by the partition 700. The bank insulating layer 160 may cover an edge of the intermediate electrode 550. The partition 700 may be disposed in an opening of the bank insulating layer 160. The upper emitting electrode 530 may be contact with the portion of the intermediate electrode 550 which is not covered by the organic light-emitting layer 520 due to the partition 700. The upper emission electrode 530 may be electrically connected to the auxiliary electrode 410 through the intermediate electrode 550.

The intermediate electrode 550 may include a conductive material. For example, the intermediate electrode 550 may include a material same as the lower emission electrode 510. The intermediate electrode 550 may have a multi-layer structure. For example, a structure of the intermediate electrode 550 may be the same as the structure of the lower emission electrode 510.

The organic light-emitting display device according to the embodiment of the present invention may further include an upper substrate 800 opposite the lower substrate 100. The upper substrate 800 may overlap with the emission area EA and the transparent area TA of the lower substrate 100. For example, the upper substrate 800 may be disposed on the light-emitting structure 500. The upper substrate 800 may include an insulating material. The upper substrate 800 may include a transparent material. For example, the upper substrate 800 may include glass or plastic.

In the organic light-emitting display device according to the embodiment of the present invention, the light-emitting structure 500 of each sub emission area may display the same color. For example, the light-emitting structure 500 of each sub emission area may include a white organic light-emitting layer 520. The organic light-emitting display device according to the embodiment of the present invention may further include a black matrix 810 and a color filter 820 on the upper substrate 800. Thus, in the organic light-emitting display device according to the embodiment of the present invention, the sub emission areas in which the light-emitting structure 500 realizing the same color are disposed may display different colors.

The organic light-emitting display device according to the embodiment of the present invention may further include a filler 900 filling a space between the lower substrate 100 and the upper substrate 800. The filler 900 may prevent the light-emitting structure 500 from being damaged by the external impact. For example, the filler 900 may extend between the light-emitting structure 500 and the color filter 820, and between the upper emitting electrode 530 and the black matrix 810.

The organic light-emitting display device according to the embodiment of the present invention is described that the light-emitting structure 500 is in direct contact with the filler 900. However, the organic light-emitting display device according to another embodiment of the present invention may further include an upper passivation layer between the light-emitting structure 500 and the filter 900. The upper passivation layer may prevent the external moisture from permeating into the light-emitting structure 500. The upper passivation layer may have a multi-layer structure. For example, the upper passivation layer may have a structure in which an inorganic layer including an inorganic material and a organic layer including an organic material are stacked.

Accordingly, in the organic light-emitting display device according to the embodiment of the present invention, the connecting clad electrode 650 which does not affect the luminous efficiency of the structure may include a repair cutting region 653 overlapping with the transparent area TA of the lower substrate 100, and the connecting clad electrode 650 may have higher transmissivity than the lower emitting electrode 510, so that, regardless of the area of the emission area EA and the luminous efficiency of the light-emitting structure 500, the reduction in the area of the transmissivity area TA due to the repair cutting region 653 may be prevented. Thus, in the organic light-emitting display device according to the embodiment of the present invention, the transparency of the transparent area TA may be improved without losing the aperture ratio and the luminescent efficiency of the emission area EA.

Figure 3:
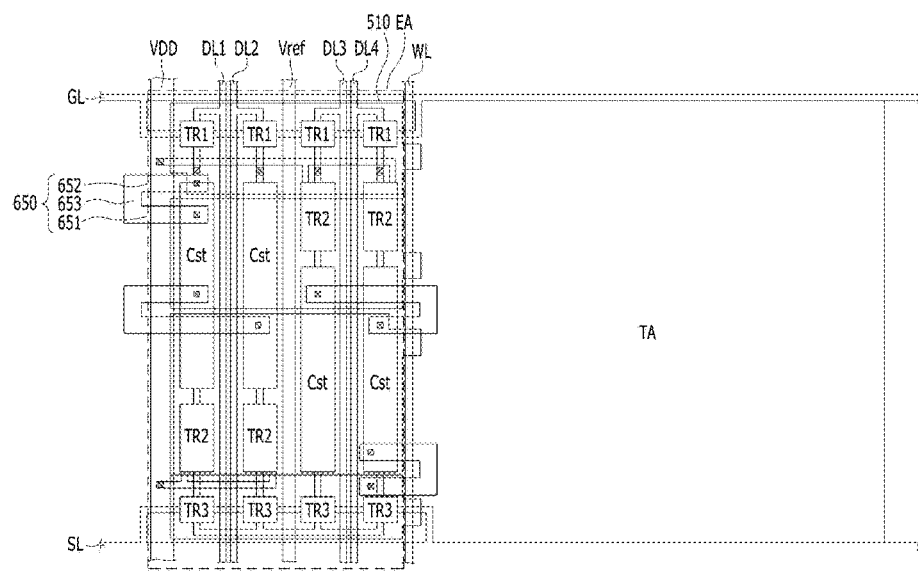
FIGS. 3 to 5 are respectively various examples of an organic light-emitting display device according to another embodiment of the present invention.

The organic light-emitting display device according to the embodiment of the present invention is described that the first connection electrode 610 and the second connection electrode 620 are extended along the connecting clad electrode 650 on the emission area EA. However, in the organic light-emitting display device according to another embodiment of the present invention, the first clad region 651 and the second clad region 652 extending onto the emission area EA from the repair cutting region 653 of the connecting clad electrode 650 overlapping with the transparent area TA may not overlap with the first connection electrode 610 or the second connection electrode 620, as shown in FIG. 3. Thus, in the organic light-emitting display device according to another embodiment of the present invention, the reduction of the area of the transparent area TA by the repair cutting region 653 may be effectively prevented.

Figure 4:
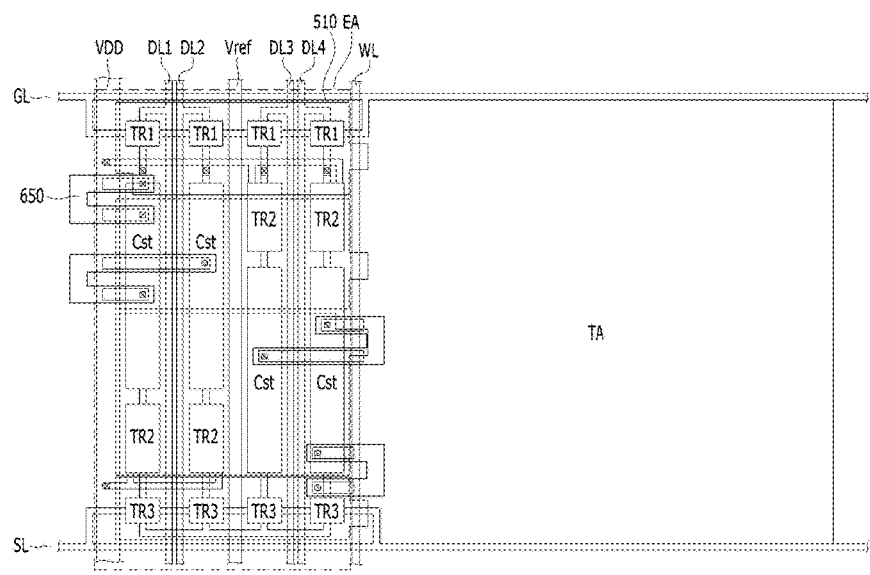
Figure 5:
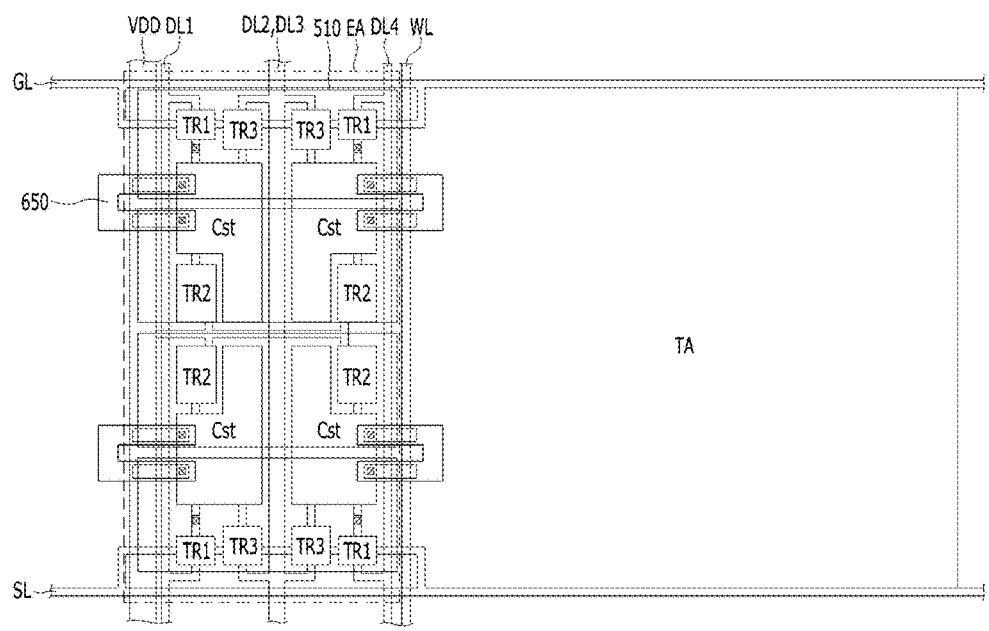

The organic light-emitting display device according to the embodiment of the present invention is described that the connecting clad electrode 650 of each sub emission area is connected to corresponding storage capacitor Cst under the lower emission electrode 510 of adjacent sub emission area. However, in the organic light-emitting display device according to another embodiment of the present invention, the connecting clad electrodes 650 may be arranged in various ways. For example, in the organic light-emitting display device according to another embodiment of the present invention, points at which the connecting clad electrodes 650 including the repair cutting region 653 located in the same direction are connected to the storage capacitor Cst may be disposed adjacent to each other, as shown in FIG. 4. Thus, in the organic light-emitting display device according to another embodiment of the present invention, the degree of freedom for arrangement of signal lines and/or voltage supply lines may be improved.

The organic light-emitting display device according to the embodiment of the present invention is described that the circuits of four sub emission area disposed in the single emission area is arranged parallel with the data lines DL1-DL4. However, in the organic light-emitting display device according to another embodiment of the present invention, the circuits of sub emission areas may be arranged in various ways. For example, in the organic light-emitting display device according to another embodiment of the present invention, the circuits of each sub emission area may be arranged in a quad type. Thus, in the organic light-emitting display device according to another embodiment of the present invention, the aperture ratio of the emission area and the area of the transparent area may be maximized.

In the result, the organic light-emitting display device according to the embodiments of the present invention may include a repair cutting region consist of a conductive layer having higher transmissivity than a lower emission electrode. Thus, in the organic light-emitting display device according to the embodiments of the present invention, the reduction of the area of a transparent area by the repair cutting region may be prevented. Thereby, in the organic light-emitting display device according to the embodiments of the present invention, the transparency of the transparent area may be increased without losing the aperture ratio of an emission area.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light-emitting display device, comprising:
   a lower substrate including an emission area and a transparent area;
   a thin film transistor on the emission area of the lower substrate;
   a light-emitting structure on the thin film transistor, the light-emitting structure including a lower emission electrode, an organic light-emitting layer and an upper emission electrode, which are sequentially stacked; and a connecting clad electrode connected between the thin film transistor and the lower emission electrode of the light-emitting structure, the connecting clad electrode having a transmissivity higher than the lower emission electrode, wherein the connecting clad electrode includes a repair cutting region overlapping with the transparent area of the lower substrate.

2. The organic light-emitting display device according to claim 1, wherein the connecting clad electrode includes a conductive oxide.

3. The organic light-emitting display device according to claim 2, wherein the connecting clad electrode includes ITO.

4. The organic light-emitting display device according to claim 1, wherein the lower emission electrode includes a reflective layer.

5. The organic light-emitting display device according to claim 1, further comprising:
a lower over-coat layer between the thin film transistor and the connecting clad electrode, the lower over-coat layer including a lower penetrating hole;
an upper over-coat layer between the connecting clad electrode and the light-emitting structure, the upper over-coat layer including an upper penetrating hole spaced apart from the lower penetrating hole; and
a first connection electrode between the lower over-coat layer and the upper over-coat layer, the first connection electrode connected to the thin film transistor through the lower penetrating hole,
wherein the connecting clad electrode further includes a first clad region covering the first connection electrode.

6. An organic light-emitting display device, comprising:
a lower substrate including an emission area and a transparent area;
a thin film transistor on the emission area of the lower substrate;
a lower over-coat layer on the thin film transistor, the lower over-coat layer including a lower penetrating hole exposing a portion of the thin film transistor;
a first connection electrode on the lower over-coat layer, the first connection electrode connected to the thin film transistor through the lower penetrating hole;
a second connection electrode on the lower over-coat layer, the second connection electrode spaced apart from the first connection electrode;
an upper over-coat layer covering the first connection electrode and the second connection electrode, the upper over-coat layer including an upper penetrating hole overlapping with the second connection electrode;
a light-emitting structure on the upper over-coat layer, the light-emitting structure including a lower emission electrode connected to the second connection electrode through the upper penetrating hole; and
a connecting clad electrode between the lower over-coat layer and the upper over-coat layer, the connecting clad electrode connected between the first connection electrode and the second connection electrode,
wherein the connecting clad electrode includes a repair cutting region overlapping with the transparent area of the lower substrate.

7. The organic light-emitting display device according to claim 6, wherein the connecting clad electrode has a transmissivity higher than the first connection electrode, the second connection electrode and the lower emission electrode.

8. The organic light-emitting display device according to claim 6, further comprising:

an auxiliary electrode between the lower over-coat layer and the upper over-coat layer; and
an auxiliary clad electrode covering the auxiliary electrode, the auxiliary clad electrode spaced apart from the first connection electrode, the second connection electrode and the connecting clad electrode,
wherein the connecting clad electrode includes a material same as the auxiliary clad electrode.

9. The organic light-emitting display device according to claim 8, wherein a structure of the first connection electrode and a structure of the second connection is the same as a structure of the auxiliary electrode.

10. An organic light-emitting display device, comprising:
a lower substrate including an emission area and a transparent area;
a thin film transistor on the emission area of the lower substrate;
a light-emitting structure on the thin film transistor, the light-emitting structure including a lower emission electrode, an organic light-emitting layer and an upper emission electrode, which are sequentially stacked; and
a connecting clad electrode connected between the thin film transistor and the light-emitting structure, the connecting clad electrode having a transmissivity higher than the lower emission electrode,
wherein the connecting clad electrode includes a repair cutting region overlapping with the transparent area of the lower substrate;
a lower over-coat layer between the thin film transistor and the connecting clad electrode, the lower over-coat layer including a lower penetrating hole;
an upper over-coat layer between the connecting clad electrode and the light-emitting structure, the upper over-coat layer including an upper penetrating hole spaced apart from the lower penetrating hole; and
a first connection electrode between the lower over-coat layer and the upper over-coat layer, the first connection electrode connected to the thin film transistor through the lower penetrating hole,
wherein the connecting clad electrode further includes a first clad region covering the first connection electrode.

11. The organic light-emitting display device according to claim 10, wherein the first connection electrode is extended along the connecting clad electrode on the emission area of the lower substrate.

12. The organic light-emitting display device according to claim 10, further comprising a second connection electrode between the lower over-coat layer and the connecting clad electrode, the second connection electrode spaced apart from the first connection electrode and including a region overlapping with the upper penetrating hole,
wherein the connecting clad electrode further includes a second clad region covering the second connection electrode.

13. The organic light-emitting display device according to claim 12, wherein the repair cutting region is disposed between the first clad region and the second clad region.

14. The organic light-emitting display device according to claim 12, wherein a structure of the second connection electrode is the same as a structure of the first connection electrode.

15. The organic light-emitting display device according to claim 12, wherein the second connection electrode is extended along the connecting clad electrode on the emission area of the lower substrate.

* * * * *